(12) United States Patent
Tran et al.

(10) Patent No.: US 6,356,112 B1
(45) Date of Patent: Mar. 12, 2002

(54) EXCLUSIVE OR/NOR CIRCUIT

(75) Inventors: Dzung Joseph Tran, Tigard; Mark W. Acuff, Hillsboro, both of OR (US)

(73) Assignee: Translogic Technology, Inc., Beaverton, OR (US)

( * ) Notice: Subject to any disclaimer, the term of this patent is extended or adjusted under 35 U.S.C. 154(b) by 0 days.

(21) Appl. No.: 09/537,969

(22) Filed: Mar. 28, 2000

(51) Int. Cl.[7] ............................................... H03K 19/21
(52) U.S. Cl. ......................... 326/52; 326/713; 326/121
(58) Field of Search ............................. 326/52–55, 112, 326/119, 121, 113

(56) References Cited

U.S. PATENT DOCUMENTS

| | | | |
|---|---|---|---|
| 4,417,161 A | * 11/1983 | Uya | ............................. 326/55 |
| 4,564,921 A | 1/1986 | Suganuma | |
| 4,592,007 A | 5/1986 | Ohhashi | |
| 4,601,007 A | 7/1986 | Uya et al. | |
| 4,709,346 A | * 11/1987 | Henlin | ......................... 326/55 |
| 4,749,887 A | * 6/1988 | Sanwo et al. | .................. 326/55 |
| 4,866,658 A | 9/1989 | Mazin et al. | |
| 4,870,609 A | 9/1989 | Yasui et al. | |
| 5,040,139 A | 8/1991 | Tran | |
| 5,343,418 A | 8/1994 | Zinger | |
| 5,736,868 A | 4/1998 | Kim et al. | |
| 5,875,124 A | 2/1999 | Takahashi | |
| 5,936,427 A | 8/1999 | Tsujihashi | |

OTHER PUBLICATIONS

Page 295 of an article entitled "Ultra High Speed Digital Device Series, vol. 2: Ultra High Speed MOS Devices" edited by Susumu Koyama; published 1986.

* cited by examiner

Primary Examiner—Michael Tokar
Assistant Examiner—Don Phu Le
(74) Attorney, Agent, or Firm—Kolisch, Hartwell, Dickinson, McCormack & Heuser

(57) ABSTRACT

A digital circuit configured to receive three or more input signals and produce an output signal corresponding to either an XOR or XNOR of the input signals. In one embodiment of the invention, the circuit includes a first section connected in series with a second section to form a three-input XOR or XNOR gate. The first section is a two-input XOR or XNOR circuit having no more than eight transistors, including two transmission gate pairs. The second section is a two-input XOR or XNOR circuit having no more than six transistors, including one transmission gate pair.

29 Claims, 5 Drawing Sheets

EXCLUSIVE OR/NOR CIRCUIT

FIELD OF THE INVENTION

The present invention relates generally to digital circuits, and more particularly to Exclusive Or/Nor circuits configured to receive three or more inputs.

BACKGROUND

Digital electronic circuits are used in virtually every modern electronic system, such as computers, watches and telephones. Under continuous pressure from users for increased functionality from electronic systems, designers and manufacturers of digital electronic circuits constantly strive to reduce the size and increase the performance of their circuits. Even modest gains in the density and/or performance of a circuit become substantial if the circuit is repeated many times within a system.

Traditionally, digital logic functions have been implemented with a plurality of discrete logic circuits or gates. Two of the most important digital logic circuits are "Exclusive Or" circuits (also referred to herein as "XOR" circuits) and "Exclusive Nor" circuits (also referred to herein as "XNOR" circuits). An XOR circuit will produce a logical one if an odd number of inputs are a logical one. The XNOR logic function is the inverse of the XOR function. Thus, the XNOR function will produce a logical one if an even number of inputs are a logical one.

Logic functions such as XOR and XNOR may be represented by truth tables which define an output for each combination of inputs. The truth tables for a two-input and a three-input XOR function are shown below in Table 1a and 1b, respectively. A similar truth table may be constructed for a four-input XOR function, etc.

TABLE 1a (two-input XOR)

| $I_0$ | $I_1$ | O |
|---|---|---|
| 0 | 0 | 0 |
| 0 | 1 | 1 |
| 1 | 0 | 1 |
| 1 | 1 | 0 |

TABLE 1b (three-input XOR)

| $I_0$ | $I_1$ | $I_2$ | O |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

Truth tables for a two-input and a three-input XNOR function are shown below in Table 2a and 2b, respectively. A similar truth table may be constructed for a four-input XNOR function, etc.

TABLE 2a (two-input XNOR)

| $I_0$ | $I_1$ | O |
|---|---|---|
| 0 | 0 | 1 |
| 0 | 1 | 0 |
| 1 | 0 | 0 |
| 1 | 1 | 1 |

TABLE 2b (three-input XNOR)

| $I_0$ | $I_1$ | $I_2$ | O |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 0 |

As can be seen from the truth tables above, a digital circuit adapted to perform an XOR function can be modified to perform an XNOR function by adding an inverter to the output of the XOR circuit. Similarly, a digital circuit adapted to perform an XNOR function can be modified to perform an XOR function by adding an inverter to the output of the XNOR circuit.

In addition, a three-input XOR or XNOR circuit may be constructed by connecting a first two-input XOR or XNOR circuit in series with a second two-input XOR or XNOR circuit. For example, a three-input XOR circuit may be constructed from a pair of two-input XOR circuits connected in series, or from a pair of two-input XNOR circuits connected in series. A three-input XNOR circuit may be constructed from an XOR circuit connected in series with an XNOR circuit, or from an XNOR circuit connected in series with an XOR circuit.

XOR gates and XNOR gates are used in a wide variety of digital circuit applications including combinational logic, adder circuits, and parity checking. Many electronic systems have multiple XOR and XNOR gates. Therefore, any reduction in the size of XOR and/or XNOR gates may result in a substantial reduction in the size of such electronic systems. Similarly, any improvement in the performance of XOR and/or XNOR gates may result in a substantial improvement in the performance of such electronic systems.

SUMMARY OF THE INVENTION

The invention provides a digital circuit configured to receive three or more input signals and produce an output signal corresponding to either an XOR or XNOR of the input signals. In one embodiment of the invention, the circuit includes a first section connected in series with a second section to form a three-input XOR or XNOR gate. The first section is a two-input XOR or XNOR circuit having no more than eight transistors, including two transmission gate pairs. The second section is a two-input XOR or XNOR circuit having no more than six transistors, including one transmission gate pair. In an alternative embodiment, the circuit includes a plurality of first sections connected in series, with the last first section in the series connected to the second section to form an N-input XOR or XNOR gate.

DETAILED DESCRIPTION

Exemplary embodiments of a digital circuit according to the present invention are indicated generally at 10 in FIGS. 1–4. Circuit 10 includes a first section 12 adapted to receive two input signals A and B, and to produce a defined output signal Q/Q' based on the two input signals. Circuit 10 also includes a second section 14 adapted to receive a third input signal C and the output of first section 12, and to produce a defined output R/R' signal based on the third input signal and the output of the first section. The output of second section 14 may be connected to an output driver 16 adapted to charge and discharge relatively large capacitive loads. Circuit 10 is configured to perform either an XOR logic function or an XNOR logic function of input signals A, B, and C depending on the configurations of first section 12 and second section 14.

As will be described in more detail below, first section 12 is adapted to produce an output Q if the logical values of signals A and B are equivalent, and to produce an output Q' if the logical values of signals A and B are opposite, where Q' is the inverse of Q. In other words, first section 12 is configured either as a two-input XOR gate or a two-input XNOR gate. The values of outputs Q and Q' will be determined by the particular configuration of first section 12. Similarly, second section 14 is adapted to produce an output R if the logical values of signals Q/Q' and C are equivalent, and to produce an output R' if the logical values of signals Q/Q' and C are opposite, where R' is the inverse of R. In other words, second section 14 is configured either as a two-input XOR gate or a two-input XNOR gate. The values of outputs R and R' will be determined by the particular configuration of second section 14.

Figure 1:
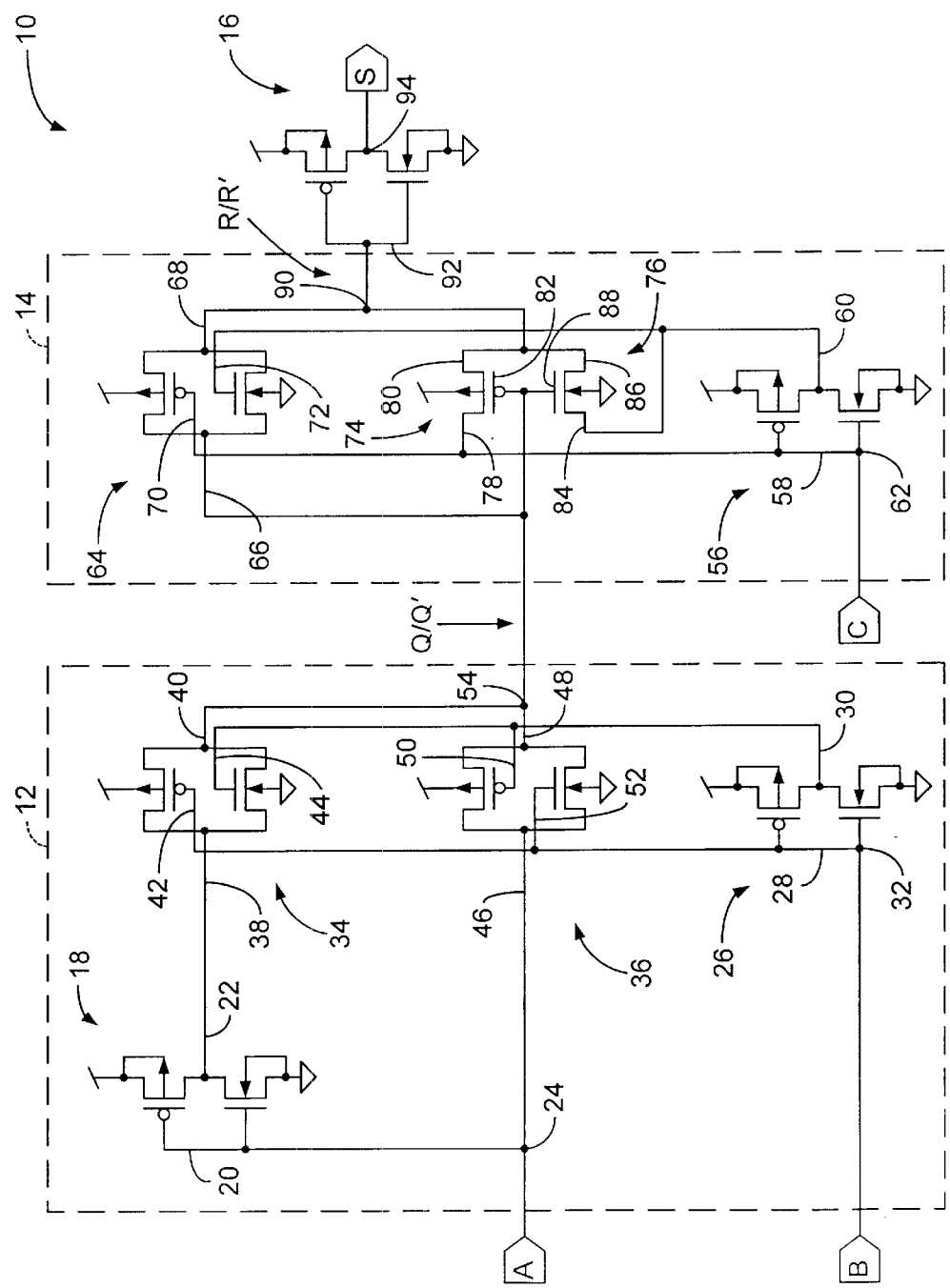
FIG. 1 is a schematic of a three-input XOR circuit according to one embodiment of the present invention.

In the embodiment depicted in FIG. 1, first section 12 is configured as a two-input XNOR gate and second section 14 is configured as a two-input XOR gate. In addition, output driver 16 is configured as an inverter. Therefore, the embodiment of circuit 10 depicted in FIG. 1 implements a three-input XOR gate. Alternatively, output driver 16 may be omitted or configured as a non-inverting driver, in which case circuit 10 would implement a three-input XNOR gate. Similarly, in the embodiment depicted in FIG. 2, first section 12 is configured as a two-input XOR gate, second section 14 is configured as a two-input XNOR gate, and output driver 16 is configured as an inverter. Therefore, the embodiment of circuit 10 depicted in FIG. 2 also implements a three-input XOR gate.

Figure 3:
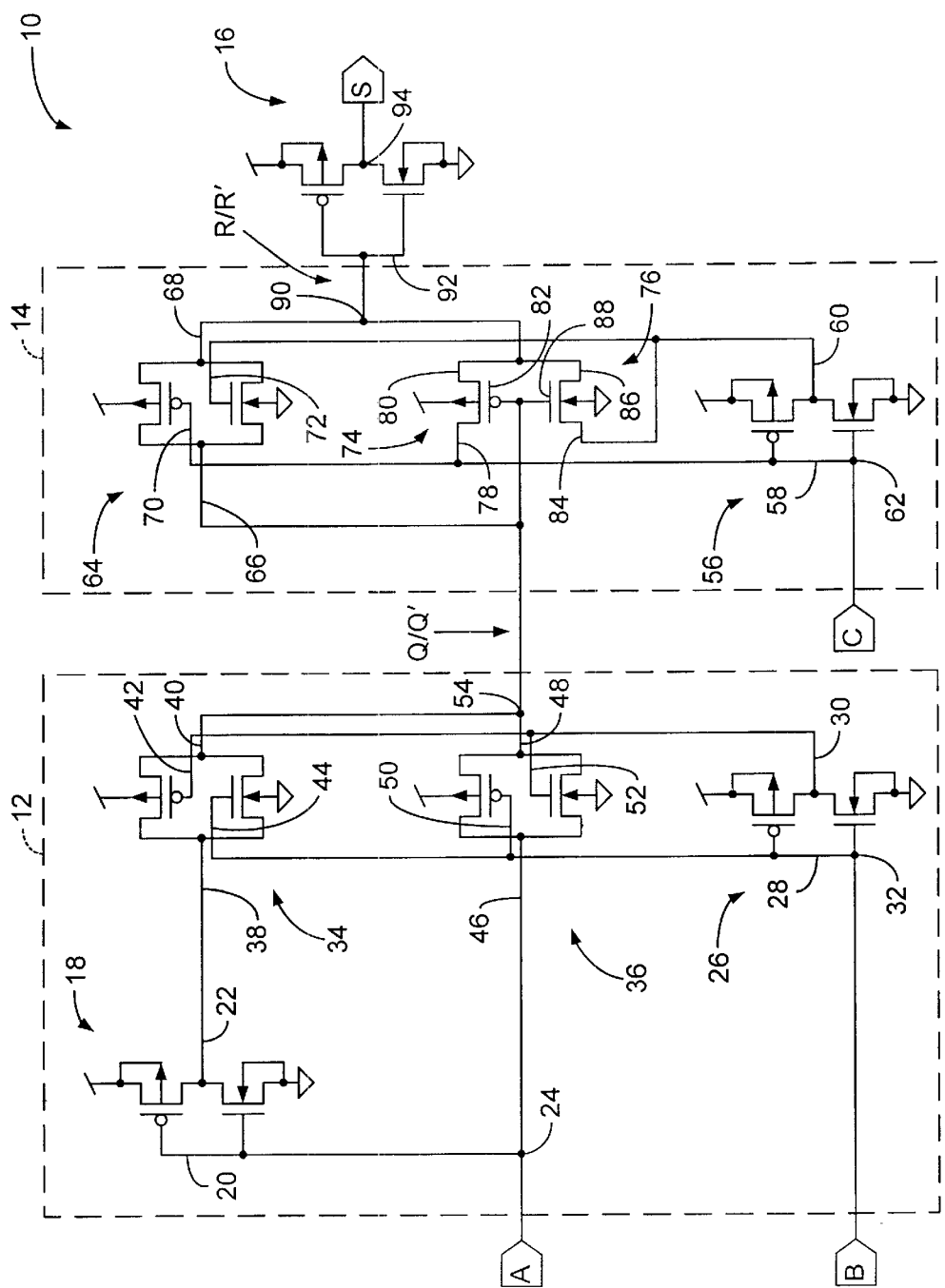
FIG. 3 is a schematic of a three-input XNOR circuit according to another embodiment of the present invention.

In the embodiment depicted in FIG. 3, first section 12 is configured as a two-input XOR gate, second section 14 is configured as a two-input XOR gate, and output driver 16 is configured as an inverter. Therefore, the embodiment of circuit 10 depicted in FIG. 3 implements a three-input XNOR gate. Similarly, in the embodiment depicted in FIG. 4, first section 12 is configured as a two-input XNOR gate, second section 14 is configured as a two-input XNOR gate, and output driver 16 is configured as an inverter. Therefore, the embodiment of circuit 10 depicted in FIG. 4 also implements a three-input XNOR gate.

The use of first section 12 connected in series with second section 14 is counter-intuitive because the two sections are different types of XOR/XNOR circuits. Nevertheless, that combination provides certain advantages over using two first sections connected in series or two second sections connected in series. As will be described in more detail below, the first section includes eight CMOS transistors while the second section includes six CMOS transistors. Therefore, circuit 10 has a smaller size than a three-input XOR/XNOR circuit that uses two first sections connected in series. However, the second section is less efficient in driving subsequent XOR/XNOR gates than is the first section. Therefore, circuit 10 is faster than a three-input XOR/XNOR circuit that uses two second sections connected in series. For the same reason, circuit 10 is also faster than a three-input XOR/XNOR circuit that uses a second section (as the first stage) connected in series with a first section. By connecting first section 12 in series with second section 14, circuit 10 achieves a balance between circuit size and performance that is not found in existing designs.

Considering FIGS. 1–4 in more detail, it can be seen that first section 12 includes a first inverter 18 having an input 20 and an output 22. Input 20 is connected to an input node 24 adapted to receive input signal A. First inverter 18 is adapted to output the inverse of signal A to output 22. First section 12 also includes a second inverter 26 having an input 28 and an output 30. Input 28 is connected to an input node 32 adapted to receive input signal B. Second inverter 26 is adapted to output the inverse of signal B to output 30.

First section 12 also includes a first transmission gate pair 34 and a second transmission gate pair 36. As is known to those of skill in the art, a transmission gate pair includes a P-channel CMOS transistor connected in parallel with an N-channel CMOS transistor. In operation, the gate of the P-channel transistor is connected to a control signal which is the inverse of the control signal connected to the N-channel transistor. The transmission gate pair is switched "on," (i.e., will transmit an input signal), when the control signal at the P-channel gate is a logical zero and the control signal at the N-channel gate is a logical one. Conversely, the transmission gate pair is switched "off," (i.e., will block an input signal), when the control signal at the P-channel gate is a logical one and the control signal at the N-channel gate is a logical zero.

First transmission gate pair 34 includes an input 38 connected to output 22 of first inverter 18, and an output 40. The first transmission gate pair also includes a P-channel gate 42 and an N-channel gate 44. First transmission gate pair 34 is adapted to transmit the inverse of signal A to output 40 when the signal at P-channel gate 42 is a logical zero and the signal at N-channel gate 44 is a logical one. Second transmission gate pair 36 includes an input 46 connected to input node 24, and an output 48. The second transmission gate pair also includes a P-channel gate 50 and an N-channel gate 52. Second transmission gate pair 36 is adapted to transmit signal A to output 48 when the signal at P-channel gate 50 is a logical zero and the signal at N-channel gate 52 is a logical one. Outputs 40 and 48 are connected together at a first output node 54. The P-channel gate of the first transmission gate pair is connected to the N-channel gate of the second transmission gate pair. Similarly, the N-channel gate of the first transmission gate pair is connected to the P-channel gate of the second transmission gate pair. Thus, the first section is adapted to output either signal A or the inverse of signal A depending on which of the first or second transmission gate pairs is switched on.

Input signal B selects which transmission gate pair is switched on and which transmission gate pair is switched off depending on the configuration of the first section. In the embodiments depicted in FIGS. 1 and 4, P-channel gate 42 of the first transmission gate pair and N-channel gate 52 of the second transmission gate pair are connected to input node 32. N-channel gate 44 of the first transmission gate pair and P-channel gate 50 of the second transmission gate pair are connected to output 30 of inverter 26. When signal B is a logical zero, the first transmission gate pair is switched on and the inverse of signal A is transmitted to first output node 54. Conversely, when signal B is a logical one, the second transmission gate pair is switched on and signal A is transmitted to first output node 54. Therefore, in the embodiments depicted in FIGS. 1 and 4, first section 12 is configured as a two-input XNOR circuit adapted to receive input signals A and B.

Figure 2:
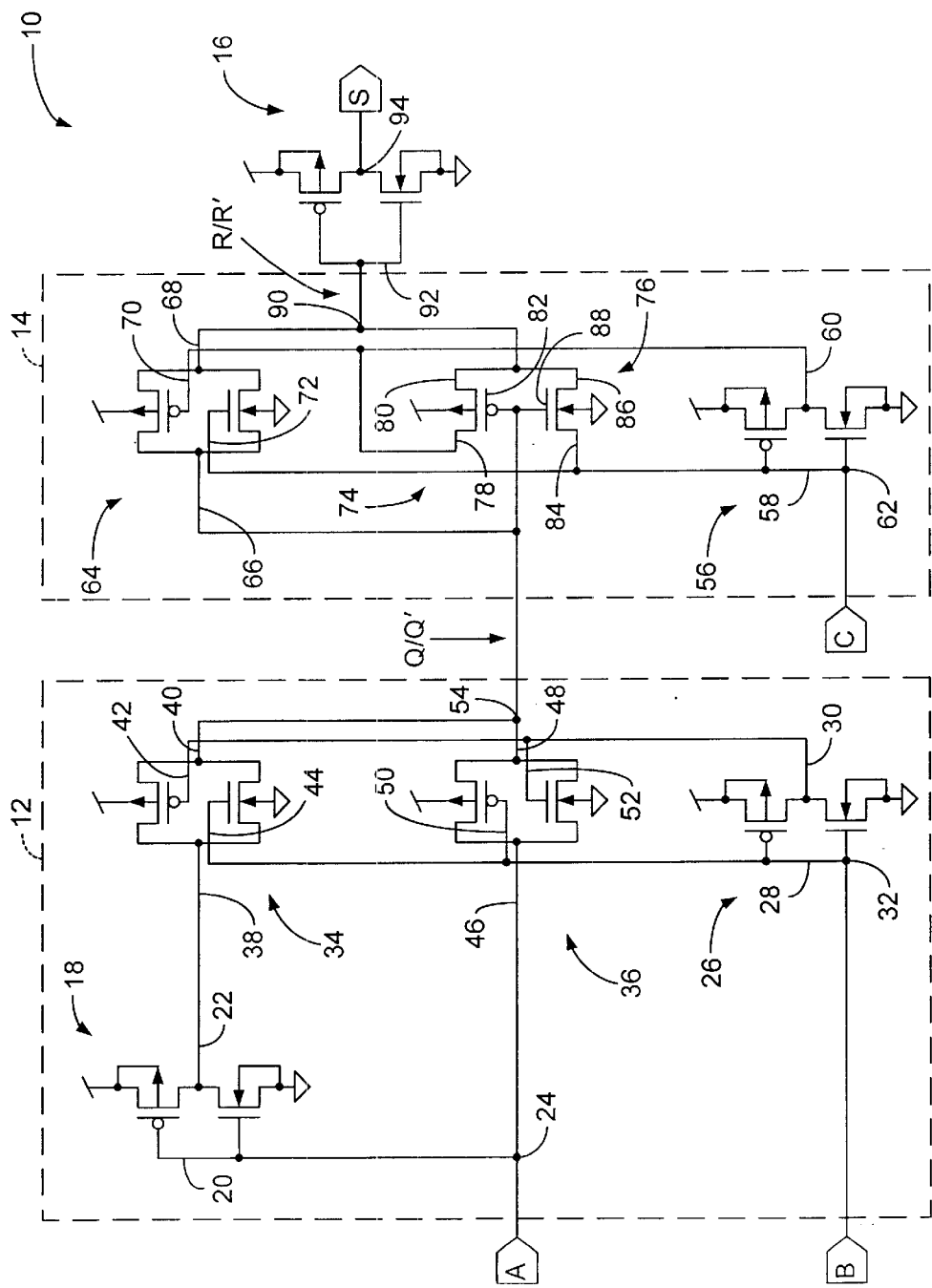
FIG. 2 is a schematic of a three-input XOR circuit according to another embodiment of the present invention.

In the embodiments depicted in FIGS. 2 and 3, P-channel gate 42 of the first transmission gate pair and N-channel gate 52 of the second transmission gate pair are connected to output 30 of inverter 26. N-channel gate 44 of the first transmission gate pair and P-channel gate 50 of the second transmission gate pair are connected to input node 32. When signal B is a logical zero, the second transmission gate pair is switched on and signal A is transmitted to first output node 54. Conversely, when signal B is a logical one, the first transmission gate pair is switched on and the inverse of signal A is transmitted to first output node 54. Therefore, in the embodiments depicted in FIGS. 2 and 3, first section 12 is configured as a two-input XOR circuit adapted to receive input signals A and B.

Returning attention back to FIGS. 1–4, the second section includes a third inverter 56 having an input 58 and an output 60. Input 58 is connected to an input node 62 adapted to receive input signal C. Third inverter 56 is adapted to output the inverse of signal C to output 60.

Second section 14 also includes a third transmission gate pair 64, having an input 66 connected to output node 54, and an output 68. The third transmission gate pair also includes a P-channel gate 70 and an N-channel gate 72. Third transmission gate pair 64 is adapted to transmit the output of first section 12 to output 68 when the signal at P-channel gate 70 is a logical zero and the signal at N-channel gate 72 is a logical one.

Second section 14 further includes a P-channel pass transistor 74, and an N-channel pass transistor 76. P-channel pass transistor 74 includes an input 78, an output 80, and a gate 82. N-channel pass transistor 76 includes an input 84, an output 86, and a gate 88. Gates 82 and 88 are connected together and to output node 54. When the output of first section 12 is a logical zero, P-channel pass transistor 74 is switched on to transmit the signal at input 78 to output 80. Conversely, when the output of first section 12 is a logical one, N-channel pass transistor 76 is switched on to transmit the signal at input 84 to output 86. The outputs of the third transmission gate pair, the P-channel pass transistor, and the N-channel pass transistor are all connected together at a second output node 90.

Input signal C selects whether the third transmission gate pair is switched on or off depending on the configuration of the second section. Additionally, the output of first section 12 selects whether signal C or its inverse is transmitted to second output node 90 depending on the configuration of the second section. In the embodiments depicted in FIGS. 1 and 3, P-channel gate 70 is connected to input node 62, and N-channel gate 72 is connected to output 60. When signal C is a logical zero, the third transmission gate pair is switched on. Conversely, when signal C is a logical one, the third transmission gate pair is switched off. In addition, input 78 of the P-channel pass transistor is connected to input node 62, while input 84 of the N-channel pass transistor is connected to output 60. When the output of first section 12 is a logical zero, signal C is transmitted to second output node 90 through P-channel pass transistor 74. Conversely, when the output of the first section is a logical one, the inverse of signal C is transmitted to second output node 90 through N-channel pass transistor 76. Therefore, in the embodiments depicted in FIGS. 1 and 3, second section 14 is configured as a two-input XOR circuit adapted to receive input signal C and the output of first section 12.

Figure 4:
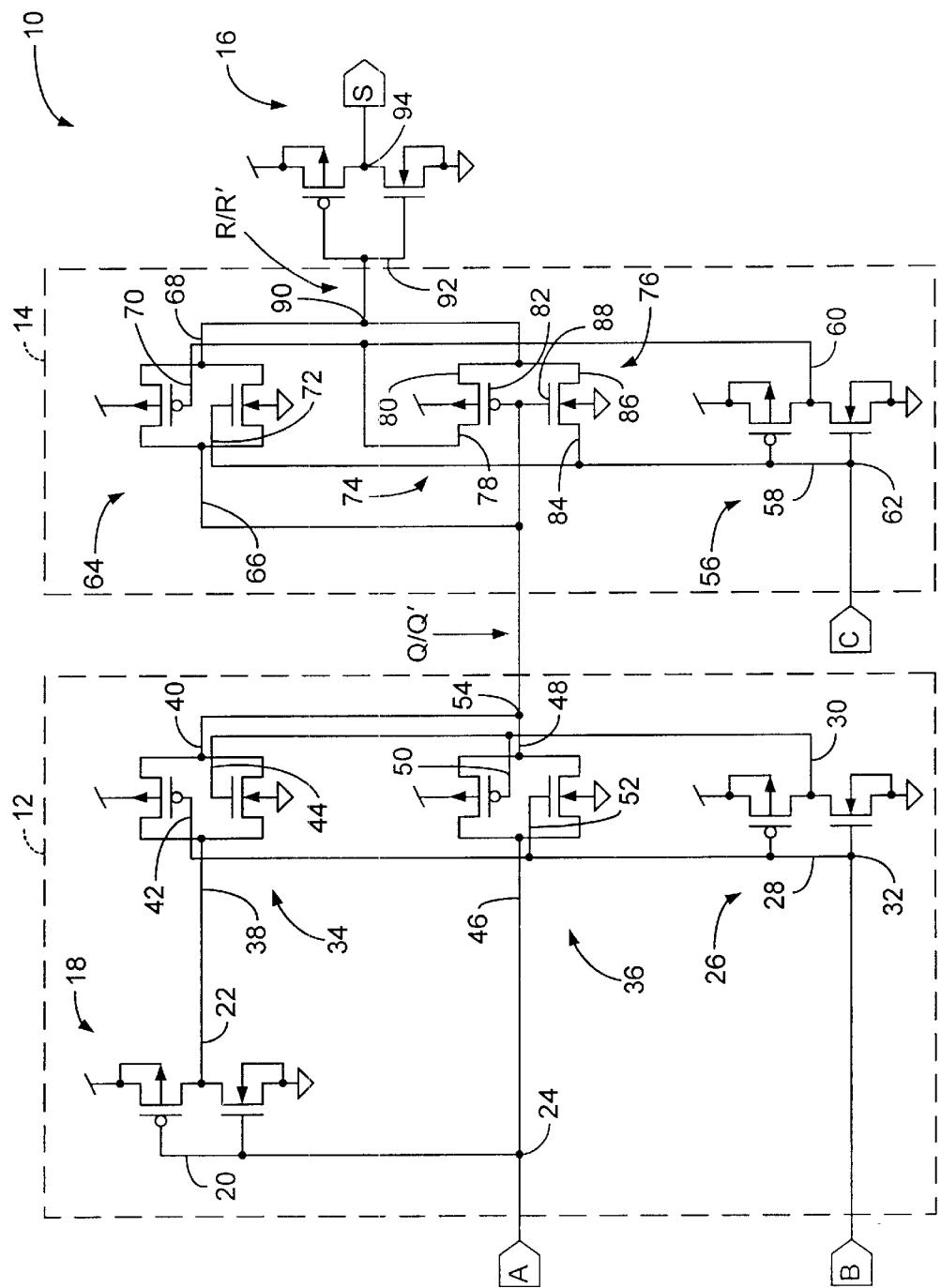
FIG. 4 is a schematic of a three-input XNOR circuit according to another embodiment of the present invention.

In the embodiments depicted in FIGS. 2 and 4, P-channel gate 70 is connected to output 60, and N-channel gate 72 is connected to input node 62. When signal C is a logical one, the third transmission gate pair is switched on. Conversely, when signal C is a logical zero, the third transmission gate pair is switched off. In addition, input 78 of the P-channel pass transistor is connected to output 60, while input 84 of the N-channel pass transistor is connected to input node 62. When the output of first section 12 is a logical one, signal C is transmitted to second output node 90. Conversely, when the output of the first section is a logical zero, the inverse of signal C is transmitted to second output node 90. Therefore, in the embodiments depicted in FIGS. 2 and 4, second section 14 is configured as a two-input XNOR circuit adapted to receive input signal C and the output of first section 12.

In the exemplary embodiment, output driver 16 is in the form of a fourth CMOS inverter having an input 92, which is connected to second output node 90 to receive the output of second section 14. Driver 16 also includes an output 94 connected to a final output node S. Driver 16 is adapted to transmit the inverse of the output of the second section to final output node S. Alternatively, driver 16 may be any suitable type of output driver, whether inverting or non-inverting.

As mentioned above, first section 12 is more efficient than second section 14 in driving capacitive loads such as subsequent XOR/XNOR stages connected in series. This is due to the number of transmission paths provided by each section. In first section 12, the output signal (i.e., signal A or the inverse of signal A) is transmitted by the two transistors of first transmission gate pair 34, or the two transistors of second transmission gate pair 36. In second section 14, however, the output signal may be transmitted by only a single transistor. When third transmission gate pair 64 is switched off, then either signal C or the inverse of signal C is transmitted through either P-channel pass transistor 74 or N-channel pass transistor 76, depending on the configuration of the second section. Assuming similar transistor sizes, the effective (worst-case) impedance of the second section is significantly higher than the impedance of the first section.

Similarly, the maximum operating speed of the second section is less than that of the first section. Under worst-case conditions for first section 12, signal A must first switch inverter 18, and then propagate across the two transistors of first transmission gate pair 34. Under worst-case conditions for second section 14, signal C must first switch inverter 56, and then propagate across P-channel pass transistor 74 (FIG. 2) or N-channel pass transistor 76 (FIG. 1). Assuming similar transistor sizes, signal A will be transmitted through the first section faster than signal C will be transmitted through the second section because signal A is transmitted through two parallel transmission paths, while signal C is transmitted through only one transmission path.

Nevertheless, second section 14 provides the advantage of a smaller circuit size (assuming similar transistor sizes).

Therefore by using second section 14 in combination with first section 12, circuit 10 achieves a balance between circuit size and performance. Furthermore, by using second section 14 as the latter stage of the circuit rather than as an initial stage, the performance limitations of the second stage are minimized since the second section is not required to drive subsequent stages. Instead, circuit 10 utilizes the higher performance of the first section to drive the second section. The second section only drives the output driver (if any).

Figure 5:
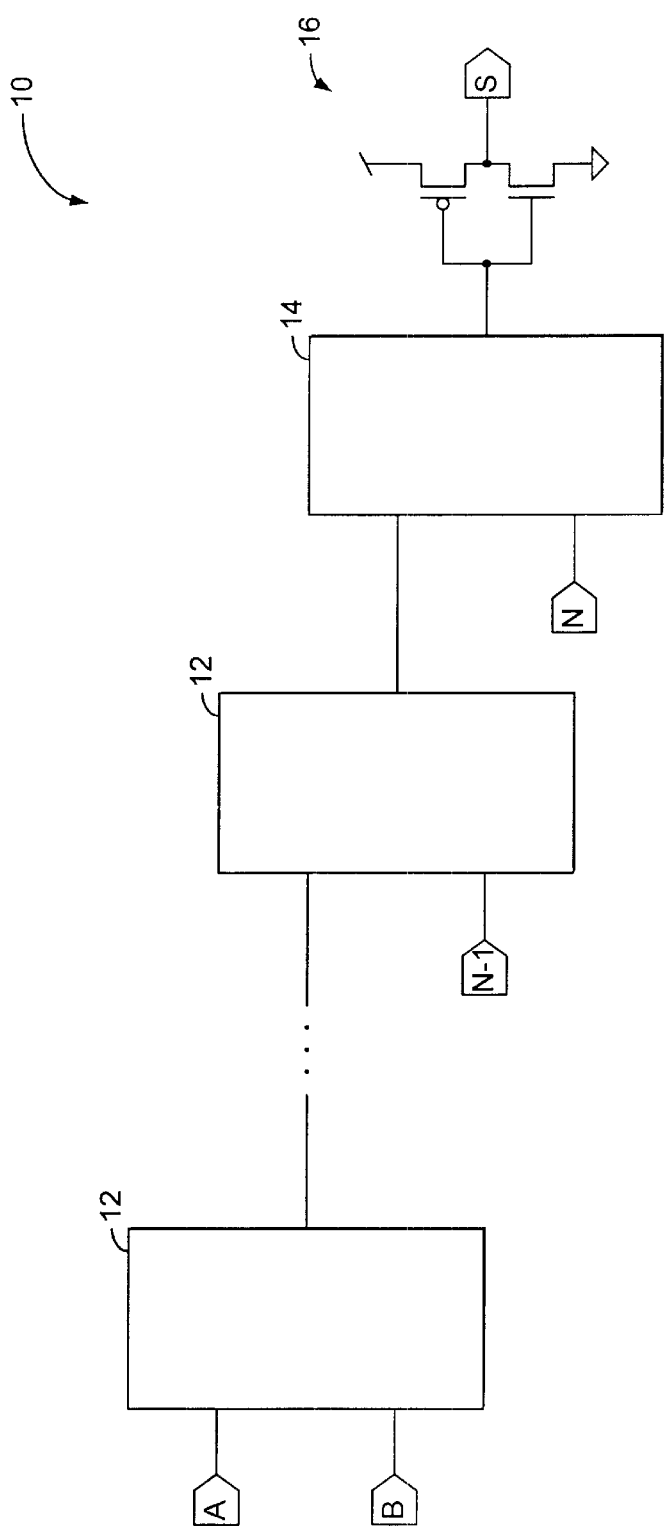
FIG. 5 is a block diagram of an N-input XOR/XNOR circuit according to an alternative embodiment of the present invention.

In an alternative embodiment of the invention illustrated in FIG. 5, circuit 10 includes a plurality of first sections 12 connected together in series as initial stages, and a second section 14 connected in series as the final stage. Optionally, the output of the second section may be connected to an output driver 16. This alternative embodiment of circuit 10 is adapted to receive N input signals and to perform either an XOR function or an XNOR fiction on the input signals depending on the configurations of the first sections and the second section. Where circuit 10 includes an even number of XNOR stages (inclusive of the second section final stage), the output of the second section will be the XOR of the inputs, while the output of driver 16 will be the XNOR of the inputs. Where circuit 10 includes an odd number of XNOR stages (inclusive of the second section final stage), the output of the second section will be the XNOR of the inputs, while the output of driver 16 will be the XOR of the inputs.

As described above, the invention provides an improved XOR/XNOR circuit that achieves a desirable balance between performance and size. The circuit may be adapted for use in a variety of applications including combinational logic design, adder circuits, parity checking, etc. Furthermore, the circuit may be adapted to provide XOR or XNOR functions for three, four, or more input signals.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A digital CMOS circuit configured to implement an XNOR function of three input signals A, B, and C, comprising:

a first section adapted to receive input signals A and B, and to transmit signal A through two transistors when signal B is in a first logic state, and to transmit the inverse of signal A through two transistors when signal B is in a second logic state opposite the first logic state; and a second section adapted to receive input signal C and the signal transmitted by the first section, and to produce an output signal corresponding to the XNOR of signals A, B, and C.

2. A digital CMOS circuit adapted to receive four or more input signals and to produce an output signal corresponding to one of the XOR or XNOR of the input signals, the circuit comprising:

a plurality of initial stages each including two transmission gate pairs, where each initial stage is configured to produce one of an XOR or XNOR output based on two inputs, and where the plurality of initial stages are connected together in series so that a first initial stage is connected to receive two of the input signals, and each subsequent initial stage is connected to receive one of the input signals and the output of the previous stage; and a final stage configured to produce one of an XOR or XNOR output based on two inputs, and where the final stage is connected to receive one of the input signals and the output of the last initial stage in the series.

3. A digital CMOS circuit comprising:

a first section having no more than eight CMOS transistors including two transmission gate pairs and two inverters and configured to receive digital input signals A and B, input signal A being coupled to an input of a first inverter and an input of a second transmission gate pair, and input signal B being coupled to an input of a second inverter and to control gates of the transmission gate pairs, the first section being adapted to produce an output Q if the logical values of signals A and B are equivalent, and to produce an output Q' if the logical values of signals A and B are opposite, where Q' is the inverse of Q; and a second section having no more than six CMOS transistors including a first P-channel transistor and a first N-channel transistor configured as a transmission gate pair, a second P-channel transistor and a second N-channel transistor configured as an inverter, a third P-channel transistor and a third N-channel transistor, where the second section is configured to receive the output of the first section and an input signal C, input signal C being coupled to an input of a third inverter, a control input of a third transmission gate pair, and an input of one of the third P-channel transistor and third N-channel transistor, and where the second section is adapted to produce an output R if the logical values of the output of the first section and signal C are equivalent, and to produce an output R' if the logical values of the output of the first section and signal C are opposite, where R' is the inverse of R;

wherein the first section is a two-input XOR circuit and the second section is a two-input XNOR circuit.

4. A digital CMOS circuit comprising:

a first section having no more than eight CMOS transistors including two transmission gate pairs and two inverters and configured to receive digital input signals A and B, input signal A being coupled to an input of a first inverter and an input of a second transmission gate pair, and input signal B being coupled to an input of a second inverter and to control gates of the transmission gate pairs, the first section being adapted to produce an output Q if the logical values of signals A and B are equivalent, and to produce an output Q' if the logical values of signals A and B are opposite, where Q' is the inverse of Q; and a second section having no more than six CMOS transistors including a first P-channel transistor and a first N-channel transistor configured as a transmission gate pair, a second P-channel transistor and a second N-channel transistor configured as an inverter, a third P-channel transistor and a third N-channel transistor, where the second section is configured to receive the output of the first section and an input signal C, input signal C being coupled to an input of a third inverter, a control input of a third transmission gate pair, and an input of one of the third P-channel transistor and third N-channel transistor, and where the second section is adapted to produce an output R if the logical values of the output of the first section and signal C are equivalent, and to produce an output R' if the logical values of the output of the first section and signal C are opposite, where R' is the inverse of R;

wherein the first section is a two-input XNOR circuit and the second section is a two-input XOR circuit.

5. A digital CMOS circuit comprising:

a first section having no more than eight CMOS transistors including two transmission gate pairs and two inverters and configured to receive digital input signals A and B, input signal A being coupled to an input of a first inverter and an input of a second transmission gate pair, and input signal B being coupled to an input of a second inverter and to control gates of the transmission gate pairs, the first section being adapted to produce an output Q if the logical values of signals A and B are equivalent, and to produce an output Q' if the logical values of signals A and B are opposite, where Q' is the inverse of Q; and a second section having no more than six CMOS transistors including a first P-channel transistor and a first N-channel transistor configured as a transmission gate pair, a second P-channel transistor and a second N-channel transistor configured as an inverter, a third P-channel transistor and a third N-channel transistor, where the second section is configured to receive the output of the first section and an input signal C, input signal C being coupled to an input of a third inverter, a control input of a third transmission gate pair, and an input of one of the third P-channel transistor and third N-channel transistor, and where the second section is adapted to produce an output R if the logical values of the output of the first section and signal C are equivalent, and to produce an output R' if the logical values of the output of the first section and signal C are opposite, where R' is the inverse of R;

wherein the first section is a two-input XNOR circuit and the second section is a two-input XNOR circuit.

6. A three-input XOR circuit, comprising:

three input nodes adapted to receive digital input signals A, B, and C;

a first CMOS inverter having an input connected to input node A and an output adapted to output the inverse of signal A;

a second CMOS inverter having an input connected to input node B and an output adapted to output the inverse of signal B;

a first CMOS transmission gate pair having an input, an output, an N-channel gate, and a P-channel gate, where the input is connected to the output of the first inverter, the N-channel gate is connected to the output of the second inverter, and the P-channel gate is connected to input node B;

a second CMOS transmission gate pair having an input, an output, an N-channel gate, and a P-channel gate, where the input is connected to input node A, the N-channel gate is connected to input node B, and the P-channel gate is connected to the output of the second inverter;

a third CMOS inverter having an input connected to input node C and an output adapted to output the inverse of signal C;

a third CMOS transmission gate pair having an input, an output, an N-channel gate, and a P-channel gate, where the input is connected to the outputs of the first and second transmission gate pairs, the N-channel gate is connected to the output of the third inverter, and the P-channel gate is connected to input node C;

a P-channel transistor having an input, an output and a gate, where the input is connected to input node C and the gate is connected to the outputs of the first and second transmission gate pairs;

an N-channel transistor having an input, an output and a gate, where the input is connected to the output of the third inverter and the gate is connected to the outputs of the first and second transmission gate pairs; and a fourth inverter having an input and an output, where the input is connected to the outputs of the third transmission gate pair, the P-channel transistor and the N-channel transistor.

7. A three-input XOR circuit, comprising:

three input nodes adapted to receive digital input signals A, B, and C;

a first CMOS inverter having an input connected to input node A and an output adapted to output the inverse of signal A;

a second CMOS inverter having an input connected to input node B and an output adapted to output the inverse of signal B;

a first CMOS transmission gate pair having an input, an output, an N-channel gate, and a P-channel gate, where the input is connected to the output of the first inverter, the N-channel gate is connected to input node B, and the P-channel gate is connected to the output of the second inverter;

a second CMOS transmission gate pair having an input, an output, an N-channel gate, and a P-channel gate, where the input is connected to input node A, the N-channel gate is connected to the output of the second inverter, and the P-channel gate is connected to input node B;

a third CMOS inverter having an input connected to input node C and an output adapted to output the inverse of signal C;

a third CMOS transmission gate pair having an input, an output, an N-channel gate, and a P-channel gate, where the input is connected to the outputs of the first and second transmission gate pairs, the N-channel gate is connected to input node C, and the P-channel gate is connected to the output of the third inverter;

a P-channel transistor having an input, an output and a gate, where the input is connected to the output of the third inverter and the gate is connected to the outputs of the first and second transmission gate pairs;

an N-channel transistor having an input, an output and a gate, where the input is connected to input node C and the gate is connected to the outputs of the first and second transmission gate pairs; and a fourth inverter having an input and an output, where the input is connected to the outputs of the third transmission gate pair, the P-channel transistor and the N-channel transistor.

8. A three-input XNOR circuit, comprising:

three input nodes adapted to receive digital input signals A, B, and C;

a first CMOS inverter having an input connected to input node A and an output adapted to output the inverse of signal A;

a second CMOS inverter having an input connected to input node B and an output adapted to output the inverse of signal B;

a first CMOS transmission gate pair having an input, an output, an N-channel gate, and a P-channel gate, where the input is connected to the output of the first inverter, the N-channel gate is connected to input node B, and the P-channel gate is connected to the output of the second inverter;

a second CMOS transmission gate pair having an input, an output, an N-channel gate, and a P-channel gate, where the input is connected to input node A, the N-channel gate is connected to the output of the second inverter, and the P-channel gate is connected to input node B;

a third CMOS inverter having an input connected to input node C and an output adapted to output the inverse of signal C;

a third CMOS transmission gate pair having an input, an output, an N-channel gate, and a P-channel gate, where the input is connected to the outputs of the first and second transmission gate pairs, the N-channel gate is connected to the output of the third inverter, and the P-channel gate is connected to input node C;

a P-channel transistor having an input, an output and a gate, where the input is connected to input node C and the gate is connected to the outputs of the first and second transmission gate pairs;

an N-channel transistor having an input, an output and a gate, where the input is connected to the output of the third inverter and the gate is connected to the outputs of the first and second transmission gate pairs; and a fourth inverter having an input and an output, where the input is connected to the outputs of the third transmission gate pair, the P-channel transistor and the N-channel transistor.

9. A three-input XNOR circuit, comprising:

three input nodes adapted to receive digital input signals A, B, and C;

a first CMOS inverter having an input connected to input node A and an output adapted to output the inverse of signal A;

a second CMOS inverter having an input connected to input node B and an output adapted to output the inverse of signal B;

a first CMOS transmission gate pair having an input, an output, an N-channel gate, and a P-channel gate, where the input is connected to the output of the first inverter, the N-channel gate is connected to the output of the second inverter, and the P-channel gate is connected to input node B;

a second CMOS transmission gate pair having an input, an output, an N-channel gate, and a P-channel gate, where the input is connected to input node A, the N-channel gate is connected to input node B, and the P-channel gate is connected to the output of the second inverter;

a third CMOS inverter having an input connected to input node C and an output adapted to output the inverse of signal C;

a third CMOS transmission gate pair having an input, an output, an N-channel gate, and a P-channel gate, where the input is connected to the outputs of the first and second transmission gate pairs, the N-channel gate is connected to input node C, and the P-channel gate is connected to the output of the third inverter;

a P-channel transistor having an input, an output and a gate, where the input is connected to the output of the third inverter and the gate is connected to the outputs of the first and second transmission gate pairs;

an N-channel transistor having an input, an output and a gate, where the input is connected to input node C and the gate is connected to the outputs of the first and second transmission gate pairs; and a fourth inverter having an input and an output, where the input is connected to the outputs of the third transmission gate pair, the P-channel transistor and the N-channel transistor.

10. A method of determining the sum of three digital input signals A, B, C, comprising:

receiving input signals A and B;

if input signal B is a logical one, transmitting input signal A to a first output node, else, inverting input signal A and transmitting the inverse of signal A to the first output node;

receiving input signal C;

if input signal C is a logical zero, transmitting the signal at the first output node to a second output node;

if the signal at the first output node is a logical zero, transmitting input signal C to the second output node;

if the signal at the first output node is a logical one, inverting input signal C and transmitting the inverse of input signal C to the second output node; and inverting the signal at the second output node to generate the sum of input signals A,B,C.

11. The method of claim 10, wherein the step of transmitting the inverse of signal A is performed by a first CMOS transmission gate pair controlled by input signal B, and wherein the step of transmitting input signal A is performed by a second CMOS transmission gate pair controlled by input signal B.

12. The method of claim 11, wherein the step of transmitting the signal at the first output node is performed by a third CMOS transmission gate pair controlled by input signal C.

13. A method of determining the sum of three digital input signals A, B, C, comprising:

receiving input signals A and B;

if input signal B is a logical zero, transmitting input signal A to a first output node, else, inverting input signal A and transmitting the inverse of signal A to the first output node;

receiving input signal C;

if input signal C is a logical one, transmitting the signal at the first output node to a second output node;

if the signal at the first output node is a logical one, transmitting input signal C to the second output node;

if the signal at the first output node is a logical zero, inverting input signal C and transmitting the inverse of input signal C to the second output node; and inverting the signal at the second output node to generate the sum of input signals A, B, C.

14. The method of claim 13, wherein the step of transmitting the inverse of signal A is performed by a first CMOS transmission gate pair controlled by input signal B, and wherein the step of transmitting input signal A is performed by a second CMOS transmission gate pair controlled by input signal B.

15. The method of claim 14, wherein the step of transmitting the signal at the first output node is performed by a third CMOS transmission gate pair controlled by input signal C.

16. A method of determining the inverse of the sum of three digital input signals A, B, C, comprising:

receiving input signals A and B;

if input signal B is a logical zero, transmitting input signal A to a first output node, else, inverting input signal A and transmitting the inverse of signal A to the first output node;

receiving input signal C;

if input signal C is a logical zero, transmitting the signal at the first output node to a second output node;

if the signal at the first output node is a logical zero, transmitting input signal C to the second output node;

if the signal at the first output node is a logical one, inverting input signal C and transmitting the inverse of input signal C to the second output node; and inverting the signal at the second output node to generate the sum of input signals A, B, C.

17. The method of claim 16, wherein the step of transmitting the inverse of signal A is performed by a first CMOS transmission gate pair controlled by input signal B, and wherein the step of transmitting input signal A is performed by a second CMOS transmission gate pair controlled by input signal B.

18. The method of claim 17, wherein the step of transmitting the signal at the first output node is performed by a third CMOS transmission gate pair controlled by input signal C.

19. A method of determining the inverse of the sum of three digital input signals A, B, C, comprising:

receiving input signals A and B;

if input signal B is a logical one, transmitting input signal A to a first output node, else, inverting input signal A and transmitting the inverse of signal A to the first output node;

receiving input signal C;

if input signal C is a logical one, transmitting the signal at the first output node to a second output node;

if the signal at the first output node is a logical one, transmitting input signal C to the second output node;

if the signal at the first output node is a logical zero, inverting input signal C and transmitting the inverse of input signal C to the second output node; and inverting the signal at the second output node to generate the sum of input signals A, B, C.

20. The method of claim 19, wherein the step of transmitting the inverse of signal A is performed by a first CMOS transmission gate pair controlled by input signal B, and wherein the step of transmitting input signal A is performed by a second CMOS transmission gate pair controlled by input signal B.

21. The method of claim 20, wherein the step of transmitting the signal at the first output node is performed by a third CMOS transmission gate pair controlled by input signal C.

22. A three-input XOR circuit, comprising:

a two-input XNOR circuit configured to receive digital inputs A and B and to generate a signal at a first output node, including
  a first transmission gate pair adapted to transmit an inverse of input A to the first output node if input B is a logical zero, and
  a second transmission gate pair adapted to transmit input A to the first output node if input B is a logical 1;

a two-input XOR circuit adapted to receive the signal at the first output node and a digital input C and to generate a signal at a second output node, including
  a third transmission gate pair adapted to transmit the signal at the first output node to the second output node if input C is a logical zero,
  a P-type transistor adapted to transmit input C to the second output node if the signal at the first output node is a logical zero, and
  an N-type transistor adapted to transmit the inverse of input C to the second output node if the signal at the first output node is a logical one; and an output driver adapted to receive the signal at the second output node and to produce an output signal S, the inverse of the signal at the second output node.

23. The circuit of claim 22, wherein the two-input XNOR circuit includes an inverter adapted to receive input A and to transmit the inverse of input A to the first transmission gate pair.

24. A three-input XNOR circuit, comprising:

a first two-input XNOR circuit configured to receive digital inputs A and B and to generate a signal at a first output node, including
  a first transmission gate pair adapted to transmit an inverse of input A to the first output node if input B is a logical zero, and
  a second transmission gate pair adapted to transmit input A to the first output node if input B is a logical 1;

a second two-input XNOR circuit adapted to receive the signal at the first output node and a digital input C and to generate a signal at a second output node, including
  a third transmission gate pair adapted to transmit the signal at the first output node to the second output node if input C is a logical one,
  a P-type transistor adapted to transmit the inverse of input C to the second output node if the signal at the first output node is a logical zero, and
  an N-type transistor adapted to transmit input C to the second output node if the signal at the first output node is a logical one; and an output driver adapted to receive the signal at the second output node and to produce an output signal S, the inverse of the signal at the second output node.

25. The circuit of claim 24, wherein the first two-input XNOR circuit includes an inverter adapted to receive input A and to transmit the inverse of input A to the first transmission gate pair.

26. A three-input XOR circuit, comprising:

a two-input XOR circuit configured to receive digital inputs A and B and to generate a signal at a first output node, including a first transmission gate pair adapted to transmit the inverse of input A to the first output node if input B is a logical one, and a second transmission gate pair adapted to transmit input A to the first output node if input B is a logical zero;

a two-input XNOR circuit adapted to receive the signal at the first output node and a digital input C and to generate a signal a second output node, including a third transmission gate pair adapted to transmit the signal at the first output node to the second output node if input C is a logical one, a P-type transistor adapted to transmit the inverse of input C to the second output node if the signal at the first output node is a logical zero, and an N-type transistor adapted to transmit input C to the second output node if the signal at the first output node is a logical one; and an output driver adapted to receive the signal at the second output node and to produce an output signal S, the inverse of the signal at the second output node.

27. The circuit of claim 26, wherein the two-input XOR circuit includes an inverter adapted to receive input A and to transmit the inverse of input A to the first transmission gate pair.

28. A three-input XNOR circuit, comprising:

a first two-input XOR circuit configured to receive digital inputs A and B and to generate a signal at a first output node, including a first transmission gate pair adapted to transmit the inverse of input A to the first output node if input B is a logical one, and a second transmission gate pair adapted to transmit input A to the first output node if input B is a logical zero;

a second two-input XOR circuit adapted to receive the signal at the first output node and a digital input C and to generate a signal at a second output node, including a third transmission gate pair adapted to transmit the signal at the first output node to the second output node if input C is a logical zero, a P-type transistor adapted to transmit input C to the second output node if the signal at the first output node is a logical zero, and an N-type transistor adapted to transmit the inverse of input C to the second output node if the signal at the first output node is a logical one; and an output driver adapted to receive the signal at the second output node and to produce an output signal S, the inverse of the signal at the second output node.

29. The circuit of claim 28, wherein the first two-input XOR circuit includes an inverter adapted to receive input A and to transmit the inverse of input A to the first transmission gate pair.

* * * * *